United States Patent
Apalkov et al.

(10) Patent No.: US 10,121,961 B2
(45) Date of Patent: Nov. 6, 2018

(54) MAGNETIC DEVICES INCLUDING MAGNETIC JUNCTIONS HAVING TILTED EASY AXES AND ENHANCED DAMPING PROGRAMMABLE USING SPIN ORBIT TORQUE

(71) Applicant: Samsung Electronics Co., LTD., Gyeonggi-do (KR)

(72) Inventors: Dmytro Apalkov, San Jose, CA (US); Xueti Tang, Fremont, CA (US); Hong-Sik Jung, Newark, CA (US); Roman Chepulskyy, Milpitas, CA (US)

(73) Assignee: Samsung Electronics Co., LTD., Gyeonggi-do (KR)

( * ) Notice: Subject to any disclaimer, the term of this patent is extended or adjusted under 35 U.S.C. 154(b) by 21 days.

(21) Appl. No.: 15/479,653

(22) Filed: Apr. 5, 2017

(65) Prior Publication Data
US 2018/0219152 A1  Aug. 2, 2018

Related U.S. Application Data
(60) Provisional application No. 62/453,104, filed on Feb. 1, 2017.

(51) Int. Cl.
| | |
|---|---|
| H01L 21/00 | (2006.01) |
| H01L 43/08 | (2006.01) |
| H01F 10/32 | (2006.01) |
| H01F 10/12 | (2006.01) |
| H01L 43/10 | (2006.01) |
| H01L 43/12 | (2006.01) |

(52) U.S. Cl.
CPC .......... *H01L 43/08* (2013.01); *H01F 10/123* (2013.01); *H01F 10/324* (2013.01); *H01L 43/10* (2013.01); *H01L 43/12* (2013.01)

(58) Field of Classification Search
CPC .................. H01G 9/2059; H01L 2227/32
See application file for complete search history.

(56) References Cited

U.S. PATENT DOCUMENTS

| | | | |
|---|---|---|---|
| 8,344,467 B2 | 1/2013 | Ohmori | |
| 9,036,407 B2 | 5/2015 | Wang | |
| 9,437,267 B2 | 9/2016 | Higo | |
| 9,444,039 B2* | 9/2016 | Huai | ........... G11C 11/16 |
| 2016/0276006 A1* | 9/2016 | Ralph | ........... G11C 11/18 |

(Continued)

FOREIGN PATENT DOCUMENTS

WO  2016122402  8/2016

*Primary Examiner* — Julio J Maldonado
*Assistant Examiner* — Andre' C Stevenson
(74) *Attorney, Agent, or Firm* — Van Pelt, Yi & James LLP

(57) ABSTRACT

A magnetic memory including a plurality of magnetic junctions and at least one spin-orbit interaction (SO) active layer is described. Each of the magnetic junctions includes a pinned layer, a free layer and a nonmagnetic spacer layer between reference and free layers. The free layer has at least one of a tilted easy axis and a high damping constant. The tilted easy axis is at a nonzero acute angle from a direction perpendicular-to-plane. The high damping constant is at least 0.02. The at least one SO active layer is adjacent to the free layer and carries a current in-plane. The at least one SO active layer exerts a SO torque on the free layer due to the current. The free layer is switchable using the SO torque.

18 Claims, 5 Drawing Sheets

(56) References Cited

U.S. PATENT DOCUMENTS

2016/0365506 A1  12/2016  Ahn
2017/0236570 A1* 8/2017  Kent .................. G11C 11/161
                                           365/158

* cited by examiner

MAGNETIC DEVICES INCLUDING MAGNETIC JUNCTIONS HAVING TILTED EASY AXES AND ENHANCED DAMPING PROGRAMMABLE USING SPIN ORBIT TORQUE

CROSS-REFERENCE TO RELATED APPLICATIONS

This application claims the benefit of provisional Patent Application Ser. No. 62/453,104, filed Feb. 1, 2017, entitled SOT MRAM WITH TILTED AXIS AND ENHANCED DAMPING, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. Some magnetic memories write to the magnetic material using a current. One such a magnetic memory programs magnetic junctions using spin-orbit interaction (SO) torque.

SO torque-based memories, such as a SO torque magnetic random access memory (SOT-MRAM), utilize conventional magnetic tunneling junctions (MTJs) in conjunction with a line having a high spin-orbit interaction (hereinafter SO line). The conventional MTJ includes a pinned (or reference) layer, a free layer and a tunneling barrier layer between the pinned and free layers. The MTJ typically resides on a substrate and may include seed and capping layer(s) as well as an antiferromagnetic (AFM) layer. The pinned layer and the free layer are magnetic. The magnetization of the pinned layer is fixed, or pinned, in a particular direction. The free layer has a changeable magnetization. The pinned layer and free layer may have their magnetizations oriented perpendicular to the plane of the layers (perpendicular-to-plane) or in the plane of the layers (in-plane). The SO line is adjacent to the free layer of the conventional MTJ. The high spin-orbit interaction may be due to a bulk effect of the material itself (spin Hall effect), due to interfacial interactions (Rashba effect), some other effect and/or some combination thereof.

In conventional SO memories utilizing a free layer having a perpendicular-to-plane magnetic moment, writing is performed by driving a current in-plane (CIP) through the SO line. In order to reliably switch the magnetic moment using the in-plane current, a modest external magnetic field or external magnetic bias is applied. The in-plane current develops an SO torque, which can be used to switch the free layer magnetic moment. Switching to the desired direction is completed using the external magnetic bias. For example, the external magnetic field, an additional AFM layer or biasing structure may magnetically bias the free layer to complete switching to the desired state. In the absence of this external magnetic field, the switching is not sufficiently reliable for use in a magnetic memory.

Although the conventional magnetic junction may be written using spin transfer and used in a spin transfer torque random access memory (STT-RAM), there are drawbacks. In general, for smaller magnetic junction sizes and higher areal density memories, the use of an external field is undesirable. Use of an AFM or biasing structure may result in limited efficiency of the SO torque. Consequently, a mechanism for improving switching in a magnetic memory is still desired.

BRIEF SUMMARY OF THE INVENTION

A magnetic memory including a plurality of magnetic junctions and at least one spin-orbit interaction (SO) active layer is described. Each of the magnetic junctions includes a pinned layer, a free layer and a nonmagnetic spacer layer between reference and free layers. The free layer has at least one of a tilted easy axis and a high damping constant. The tilted easy axis is at a nonzero acute angle from a direction perpendicular-to-plane. The high damping constant is at least 0.02. The at least one SO active layer is adjacent to the free layer and carries a current in-plane. The at least one SO active layer exerts a SO torque on the free layer due to the current. The free layer is switchable using the SO torque.

DETAILED DESCRIPTION OF THE INVENTION

Figure 1:
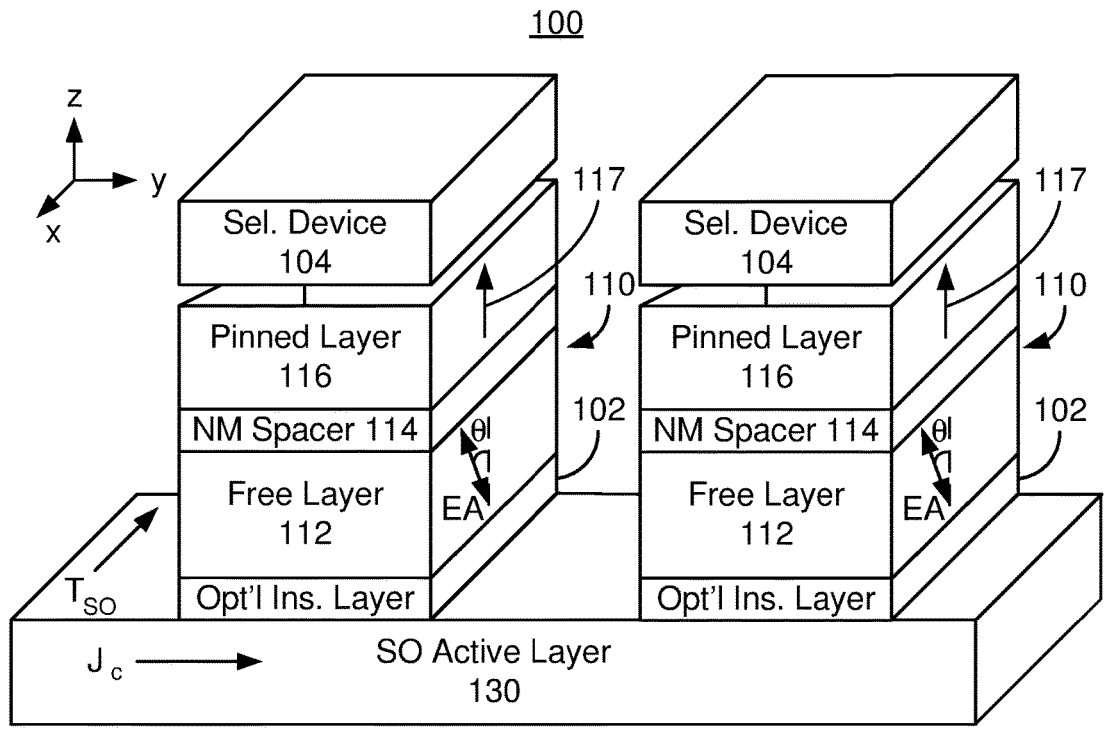
FIG. 1 depicts a perspective view of an exemplary embodiment of a magnetic memory including magnetic junctions programmable using SO torque and including a tilted easy axis and/or a high damping constant.

The exemplary embodiments relate to magnetic junctions usable in magnetic devices, such as magnetic memories, and the devices using such magnetic junctions. The magnetic memories may include magnetic random access memories (MRAMs) and may be used in electronic devices employing nonvolatile memory. Such electronic devices include but are not limited to cellular phones, smart phones, tables, laptops and other portable and non-portable computing devices. The following description is presented to enable one of ordinary skill in the art to make and use the invention and is provided in the context of a patent application and its requirements.

Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps, substeps and/or steps in different orders that are not inconsistent with the exemplary embodiments. Thus, the present invention is not intended to be limited to the embodiments shown, but is to be accorded the widest scope consistent with the principles and features described herein.

A magnetic memory including a plurality of magnetic junctions and at least one spin-orbit interaction (SO) active layer is described. Each of the magnetic junctions includes a pinned layer, a free layer and a nonmagnetic spacer layer between reference and free layers. The free layer has at least one of a tilted easy axis and a high damping constant. The tilted easy axis is at a nonzero acute angle from a direction perpendicular-to-plane. The high damping constant is at least 0.02. The at least one SO active layer is adjacent to the free layer and carries a current in-plane. The at least one SO active layer exerts a SO torque on the free layer due to the current. The free layer is switchable using the SO torque.

The exemplary embodiments are described in the context of particular methods, magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin orbit interaction phenomenon, magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions having particular layers. However, one of ordinary skill in the art will readily recognize that magnetic junctions having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction.

FIG. 1 depicts a perspective view of an exemplary embodiment of a magnetic memory 100 including magnetic junctions and programmable using SO torque and having a tilted easy axis and/or high damping constant. For clarity, FIG. 1 is not to scale. In addition, portions of the magnetic memory 100 such as bit lines, row and column selectors are not shown. The magnetic memory 100 includes magnetic junctions 110, selection devices 104 and a spin-orbit interaction (SO) active layer 130 analogous to the SO line described above. Also shown is an optional insertion layer 102 that may be between the SO active layer 130 and the magnetic junction 110. The selection device 104 may be a transistor. In other embodiments, other selection device(s) that may have other locations may be used. In the embodiment shown, a memory cell includes the magnetic junction 110 and the selection device 104. In other embodiments, a memory cell may include other and/or additional components. Typically, multiple magnetic junctions 100 and multiple memory cells are included in the magnetic memory 100. The magnetic memory 100 may be used in a variety of electronic devices.

The magnetic junction 110 includes a free layer 112, a nonmagnetic spacer layer 114 and a pinned layer 116 having magnetic moment 117. The magnetic junction 110 may also include optional polarization enhancement layer(s) (PEL(s)) having a high spin polarization. For example, a PEL might include Fe, CoFe and/or CoFeB. Bottom contact, top contact, optional seed layer(s) and optional capping layer(s) may be present but are not shown for simplicity. The seed layer(s) may include a thin, crystalline MgO seed layer having a 200 orientation. Such an MgO layer may enhance the perpendicular magnetic anisotropy (PMA) of the adjacent layer. Similarly the capping layer(s) may include a thin, crystalline 200 MgO layer to enhance the PMA of the adjacent layer. Other seed and/or capping layers may be used. In some embodiments, the SO active layer 130 is closer to the substrate (not shown) than the magnetic junction 110. In other embodiments, the magnetic junction 110 is closer to the substrate (not shown) than the SO active layer 130. The optional insertion layer 102 is nonmagnetic and may reside between the free layer 112 and the SO active layer 130 to moderate the SO interaction. An optional pinning layer (not shown) may be used to fix the magnetization (not shown) of the pinned layer 116. The optional pinning layer may be an AFM layer or multilayer that pins the magnetization (not shown) of the pinned layer 116 by an exchange-bias interaction. However, in other embodiments, the optional pinning layer may be omitted or another structure may be used. For example, in the embodiment shown in which the magnetic moment 117 of the pinned layer 116 is perpendicular-to-plane, such an AFM layer is omitted.

The magnetic junction 100 is configured such that the free layer 112 is switchable between stable magnetic states using a write current which is passed through the SO active layer 130 in the plane of the SO active layer 130. Thus, the free layer 112 is programmable using SO torque. The free layer 112 is programmable in the absence of a write current driven through the magnetic junction 110. Stated differently, spin transfer torque (STT) is not needed to write to the magnetic junction 110. In embodiments in which the free layer 112 has the tilted easy axis EA, the free layer 112 is programmable in the absence of an external magnetic field or magnetic bias. In alternate embodiments, however, a modest current driven through the magnetic junction 110 and/or an external magnetic field/magnetic bias may be used to assist in switching the free layer magnetic moment. In the embodiment shown, the free layer 112 may have its magnetic moment stable out-of-plane.

The nonmagnetic NM spacer layer 114 is between pinned layer 116 and the free layer 112. The nonmagnetic spacer layer 114 may be an MgO tunneling barrier layer. The MgO layer may be crystalline and have a 200 orientation for enhanced tunneling magnetoresistance (TMR). In other embodiments, the nonmagnetic spacer layer 114 may be a different tunneling barrier layer, may be a conductive layer or may have another structure.

The pinned layer 116 is magnetic and may be a multilayer. For example the pinned layer 116 may be a synthetic antiferromagnet (SAF) including multiple ferromagnetic layers interleaved with and sandwiching nonmagnetic layer(s) such as Ru. Other multilayers may be used in the pinned layer 116. The PMA energy of the pinned layer 116 exceeds its out-of-plane demagnetization energy in the embodiment shown. Because the pinned layer 116 has a high PMA (PMA energy exceeding the out-of-plane demagnetization energy), the magnetic moment 117 of the pinned layer 116 may be perpendicular-to-plane. Thus, the magnetic moment 117 may be along the positive z-direction as shown or antiparallel to the direction shown in FIG. 1. For example, the pinned layer 116 may include or consist of a multilayer including one or more repeats of a Co/Pt bilayer, a CoPt alloy, a CoTb alloy and/or multiple repeats of a Co/Tb bilayer. Such combinations may have a high PMA. Similarly, the pinned layer 116 may include one or more of CoFeB, FeB, CoB, Fe, $Co_2FeAl$, $Co_2FeAlSi$, $Co_2MnSi$, MnGe and MnAl, which may have a high PMA. Note that as used herein CoFeB, FeB, CoB, CoPt and other materials listed denote alloys in which the stoichiometry is not indicated. For example, CoFeB may include $(CoFe)_{1-x}B_x$, where x is greater than or equal to zero and less than or equal to 0.5 as-deposited. For example, x may be at least 0.2 and not more than 0.4. Other materials and/or structures are having a high PMA possible for the pinned layer 116. In other embodiments, the magnetic moment 141 of the pinned layer 116 may be in-plane.

The free layer 112 is magnetic and may be a multilayer. The free layer 112 includes at least one of a tilted easy axis and a high damping constant. In the embodiment shown, free layer 112 may have the tilted easy axis, EA. A tilted easy axis is one that is at a nonzero acute angle from a direction perpendicular-to-plane. Such a tilted easy axis may provide faster switching at a lower switching current, as discussed below. For the free layer 112 the perpendicular-to-plane direction is the z-direction. Thus, the tilted easy axis EA is at a nonzero acute angle, $\theta$, from the z-direction. In some embodiments, the nonzero acute angle $\theta$ is at least two degrees and not more than twenty degrees. The nonzero acute angle $\theta$ is at least five degrees in some embodiments. In some such embodiments, $\theta$ is not more than ten degrees. In the embodiment shown, the tilted easy axis EA is also in the x-z plane. If the free layer 112 has the tilted easy axis EA, the magnetic moment of the free layer 112 may be switched using only SO torque, in the absence of an external magnetic field and without an external magnetic bias.

The tilted easy axis EA may be achieved in a number of ways. In some embodiments, the tilted easy axis EA may be achieved by fabricating one or more layers with a tilted easy axis. For example, the free layer 112 may consist of or include a bilayer of L10 CoPt (111) layer on an MgO/Pt (111) underlayer. Such an L10 CoPt layer may have a tilted easy axis analogous to EA. The free layer 112 may include or consist of a $Tb_x(Fe_{50}Co_{50})_{1-x}$ layer where x is greater than zero and less than one. Such a TbFeCo layer may have a tilted easy axis if it is deposited in a magnetic field having the appropriate magnitude and direction and/or annealed in a magnetic field having the appropriate magnitude and direction. In general, a high magnetic field, for example greater than 3T, is used for the deposition and/or anneal. A $Fe_3Pt/[FePt/MgO]_2$ bilayer may be included in or form the free layer 112. Such a FePt/[FePt/MgO] may have a tilted easy axis under some conditions.

The free layer 112 may also be formed of a multilayer that includes one or more of the layers described above. For example, the free layer 112 may include a perpendicular layer having a high PMA energy magnetically coupled to another, selection layer. As used herein, a high PMA energy is a PMA energy greater than an out-of-plane demagnetization energy. In the absence of other layers, such a layer has a magnetic moment that is perpendicular-to-plane. This high PMA energy layer may be coupled to the selection layer through a coupling layer, which may be amorphous. The selection layer may be a tilted easy axis layer or an in-plane anisotropic layer. The selection layer is so termed because it is the tilted easy axis that allows the free layer 112 to be written to the desired (selected) state without requiring the application of an external magnetic field. In an embodiment in which the free layer includes the high PMA layer, the selection layer and the coupling layer, the free layer tilted easy axis is due to the selection layer. The tilted easy axis layer may be one or more of the layer(s) described above. The combination of the high PMA layer and the tilted easy axis layer provide the tilted easy axis EA for the free layer 112. The in-plane anisotropic layer not only has a magnetic moment that is in plane, but also has a preferred direction in-plane. Such a preferred direction may be a direction for which the magnetic energy is lowest. The combination of the high PMA layer and the in-plane anisotropic layer form the tilted easy axis EA for the free layer 112. Other single layers and/or multilayers that allow the free layer to have the tilted easy axis EA may be used.

The SO active layer 130 is a layer that has a strong spin-orbit interaction and is used in switching the magnetic moment (not shown) of the free layer 112. A write current is driven in-plane along the length of the SO active layer 130 in the +y direction or the −y direction. The arrow $J_c$ in FIG. 1 represents the current density for the write current driven through the SO active layer 130 in the +y direction. This write current gives rise to an attendant SO interaction, which results in the spin-orbit torque $T_{SO}$ shown in FIG. 1. A write current in the −y direction would result in a spin-orbit torque (SO torque) in the opposite direction. The SO torques in the +x direction and the −x direction may be used to program the magnetic moment of the free layer 112 to the desired state. SO torque occurs for a current driven in-plane in the SO active layer 130 and a spin-orbit interaction. This is in contrast to STT, which is due to a perpendicular-to-plane current flowing through the magnetic junction 110 and that injects spin polarized charge carriers into the free layer 112. In some embodiments, programming of the magnetic junction 110 is completed using SO torque alone. In other embodiments, another mechanism such as spin transfer may also be used in switching. The SO torque generated in the SO active layer 130 may thus be used in switching the magnetic moment of the free layer 112.

In operation, the magnetic junction 110 may be read in a conventional manner. Thus, a read current insufficient to program the magnetic junction 110 using STT may be driven through the magnetic junction 110 in the CPP (current perpendicular-to-plane) direction. The resistance of the magnetic junction 110 is based on the orientation between the free layer magnetic moment and the pinned layer magnetic moments 117. Thus, data may be read from the magnetic junction 110 by determining the resistance of the magnetic junction 110.

In programming the magnetic junction 110, however, a write current corresponding to current density $J_c$ may be driven in-plane through the SO active layer 130. The free layer magnetic moment may be switched using only SO torque because the free layer 112 has a tilted easy axis. More specifically, the SO torque generated by the SO active layer 130 may commence switching of the free layer magnetic moment, but the selection of the final state of the free layer magnetic moment may be achieved without an external magnetic field because of the tilted easy axis EA.

Figure 2A:
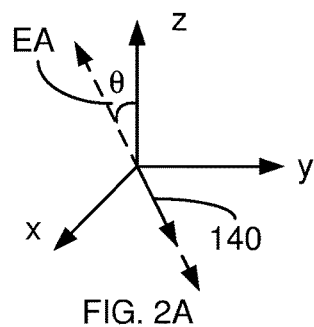
FIGS. 2A-2C depict exemplary embodiments the magnetic moment of a free layer before, during and after switching using SO torque.
Figure 2B:
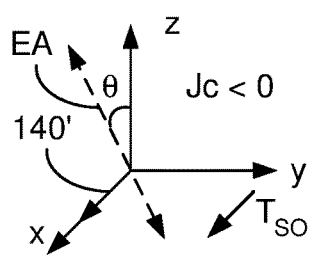
Figure 2C:
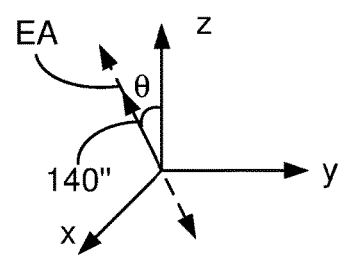
Figure 3A:
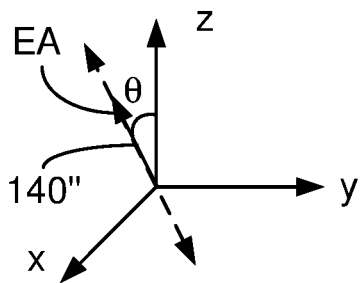
FIGS. 3A-3C depict exemplary embodiments the magnetic moment of a free layer before, during and after switching using SO torque.
Figure 3B:
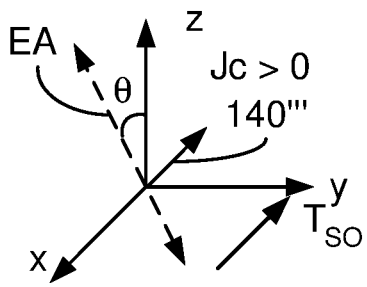
Figure 3C:
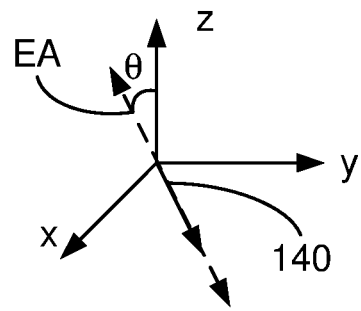

To better understand switching of the free layer 112 that has a tilted easy axis, refer to FIGS. 2A-2C through FIGS. 3A-3C in addition to FIG. 1. FIGS. 2A-2C depict exemplary embodiments the magnetic moment of the free layer 112 switching from a first stable state 140 to a second stable state 140" using SO torque. FIGS. 3A-3C depict exemplary embodiments the magnetic moment of the free layer switching from the second stable state 140" to the first stable state 140 using SO torque. FIG. 2A depicts the tilted easy axis, EA and magnetic moment 140 of the free layer that is in a first state. The easy axis EA is in the x-z plane, at the angle θ from the z-axis. The first state is such that the magnetic moment 140 has components in the −x direction and the −z direction and is along the tilted easy axis EA.

A write current having density $J_c$ that is less than zero (opposite to the direction for $J_c$ shown in FIG. 1) is driven through the SO active layer 130 in plane. Stated differently, a write current is driven through the SO active layer 130 in the negative y direction. This current generates an SO torque in the positive x-direction. In response to the SO torque, the magnetic moment 140' transitions to be in the positive x-direction, as shown in FIG. 2B. As can be seen in FIG. 2B, the moment 140' is along a component of the easy axis EA in the positive x-direction. Upon removal of the write current, the moment 140" relaxes to align with the easy axis EA. Because of the direction of the easy axis EA, the moment 140" relaxes to be in the second stable state, having components in the positive x-direction and positive z-direction. This can be seen in FIG. 2C.

FIGS. 3A-3C depict switching from the second stable state 140" to the first stable stage 140. FIG. 3A depicts the tilted easy axis, EA and magnetic moment 140" that is in the second stable state. The easy axis EA is still in the x-z plane, at an angle θ from the z-axis. A write current having density $J_c$ that is greater than zero is driven through the SO active layer 130 in plane (e.g. in the positive y-direction in FIG. 1). This write current generates an SO torque in the negative x-direction. In response to the resulting SO torque, the magnetic moment 140''' transitions to be along the x-axis, in the negative x direction. This can be seen in FIG. 3B. As can be seen in FIG. 3B, the moment 140''' is along a component of the easy axis EA closer to the second stable state. Upon removal of the write current, the moment 140 relaxes to align with the easy axis EA. Because of the direction of the easy axis EA, the moment 140 relaxes to be in the first stable state 140.

Thus, the SO torque may destabilize the magnetic moment of the free layer 112 from its stable states 140 or 140". Because of the tilt in the easy axis EA, SO torques in opposite directions are closer to different stable states in opposite directions along the easy axis EA. The combination of the tilted easy axis EA and the SO torque results in the magnetic moment switching between the desired stable states 140 and 140". Thus, switching of the magnetic moment of the free layer 112 may be accomplished using an in-plane write current through the SO active layer and an SO torque without requiring an external magnetic field or magnetic bias.

In addition to or in lieu of the tilted easy axis, the free layer 112 may also have a high damping constant. The high damping constant is at least 0.02. The high damping constant may be at least 0.1. In some embodiments, the high damping constant is at least 0.5. In some cases, the damping constant does not exceed 0.8. A high damping constant may be provided by doping the free layer 112. The doping increases the damping constant of the free layer 112 to at least five through ten multiplied by the free layer damping constant in the absence of doping. For example, at least five atomic percent and not more than twenty atomic percent of a dopant may be used to obtain the high damping constant of at least 0.02 described above. The upper limit on the dopant may be due to a desire to maintain a sufficiently high magnetoresistance rather than a limit due to damping. In some embodiments, the dopant(s) may include at least one of Pt, Ir, Os, Re, W, Bi, Sm, Ho, Dy, Er. In some embodiments, the dopant(s) are selected from Dy, W and Bi.

Use of a high damping free layer 112 may result in faster switching of the free layer 112 between stable magnetic states. In switching using SO torque, the ringing time is the time for the magnetic moment to settle into a stable state. The ringing time depends on the damping constant, α. A larger damping constant results in less ringing and faster settling into the final, stable state. Thus, SO torque switching may be more rapidly accomplished for a free layer having a damping constant in the ranges described above.

The magnetic memory 100 may have improved performance. The free layer 112 may be programmed using SO torque and a current driven in-plane through the SO active layer 130. Because no STT write current is driven through the magnetic junction 110 for programming, damage to the magnetic junction 110 may be avoided. If the free layer 112 has the tilted easy axis EA, no external magnetic field is required for writing to the desired state using SO torque. Consequently, additional current carrying lines need not be included. The use of a long range magnetic field that may disturb neighboring magnetic junctions may also be avoided. If the free layer 112 has a high damping constant, switching using SO torque may be fast. If the free layer 112 has both a tilted easy axis and a high damping constant, then fast switching may be achieved in the absence of an external magnetic field. Thus, performance of the magnetic memory 100 may be improved.

Figure 4:
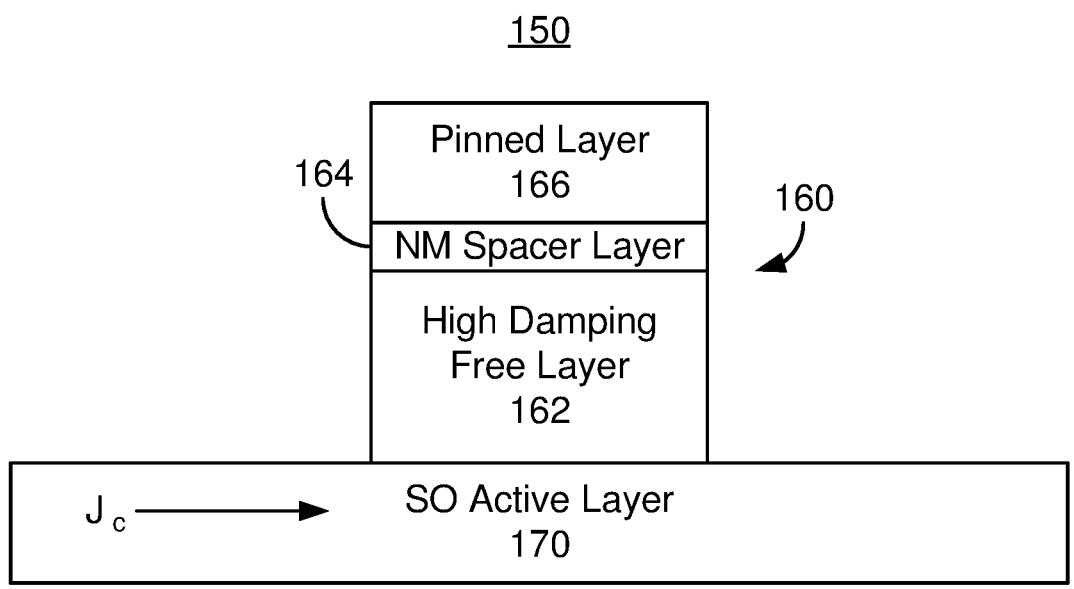
FIG. 4 depicts a side view of another exemplary embodiment of a magnetic memory including magnetic junctions programmable using SO torque and including a high damping constant.

FIG. 4 depicts a side view of another exemplary embodiment of a magnetic memory 150 including a magnetic junction 160 programmable using SO torque as well as an SO active layer 170. For clarity, FIG. 4 is not to scale. Further, only some components are shown for clarity. For example, the selection device and optional insertion layer are not shown. Although only one magnetic junction 160 and one SO active layer 170 are shown, multiple instances of one or both may be included. The magnetic memory 150 may be used in a variety of electronic devices and is analogous to the magnetic memory 100. As a result, similar components have similar labels. The magnetic memory 150 includes an SO active layer 170 and a magnetic junction 160 including a free layer 162, a nonmagnetic spacer layer 164 and a pinned layer 166 analogous to the SO active layer 130 and the magnetic junction 110 including the free layer 112, the nonmagnetic spacer layer 114 and the pinned layer 116, respectively. Thus, the components 160, 162, 164, 166 and 170 may have similar structure, function and/or location to those of the components 110, 112, 130, 116 and 130, respectively. Although not shown, an underlying substrate, contacts, seed layer(s), high PMA layer(s), optional insertion layer(s) and/or capping layer(s) analogous to those described above may be present.

As can be seen in FIG. 4, the free layer 162 has a high damping constant. The high damping constant is at least 0.02. The high damping constant may be at least 0.1. In some embodiments, the high damping constant is at least 0.5 and not more than 0.8. A high damping constant may be provided by doping the free layer 162. For example, at least five atomic percent and not more than twenty atomic percent of a dopant may be used. In some embodiments, the dopant(s) may include at least one of at least one of Pt, Ir, Os, Re, W, Bi, Sm, Ho, Dy, Er. In some embodiments, the dopant(s) are selected from Dy, W and Bi. The amount of dopant added may be sufficient to increase the damping constant of the free layer 162 to be at least five times through ten multiplied by the damping constant in the absence of the dopant. In some embodiments, the dopant might increase the damping constant to be even more than ten multiplied by the damping constant in the absence of the dopant. As discussed above, the free layer 162 may also have a tilted easy axis.

The magnetic memory 150 may have improved performance. The free layer 162 may be programmed using SO torque and a write current driven in-plane through the SO active layer 170. Thus, damage to the magnetic junction 160 that may occur due to a current driven perpendicular-to-plane through the magnetic junction 160 may be avoided. The free layer 162 has a higher damping constant. Consequently, switching using SO torque may be fast. However, if the free layer 162 does not have a tilted easy axes, then an external magnetic field may be applied to select the final state to which the free layer 112 switches. Thus, performance of the magnetic memory 150 may be improved.

Figure 5:
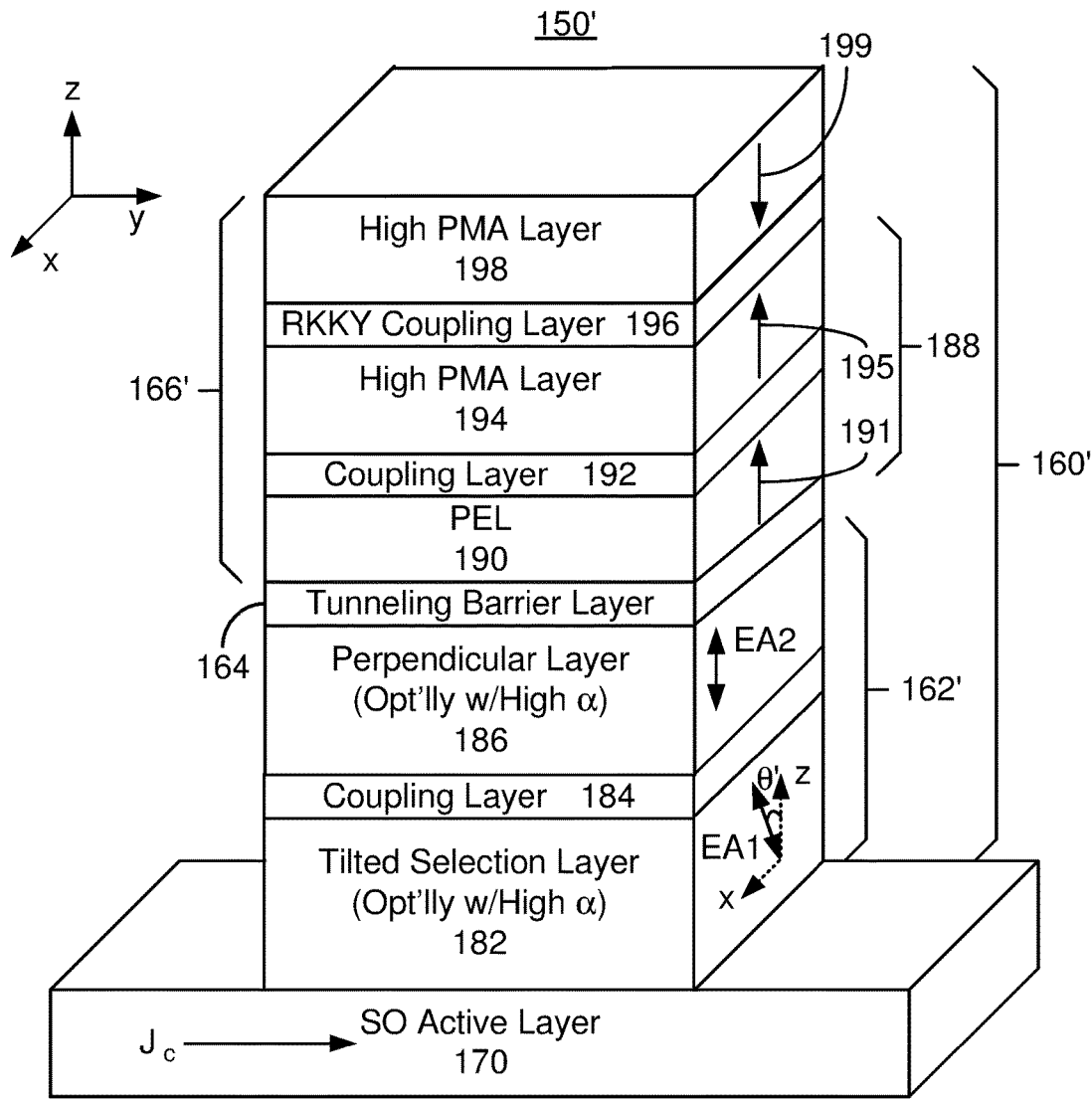
FIG. 5 depicts a perspective view of another exemplary embodiment of a magnetic memory including magnetic junctions programmable using SO torque and including a tilted easy axis and/or a high damping constant.

FIG. 5 depicts a perspective view of another exemplary embodiment of a magnetic memory 150' including magnetic junction(s) 160' programmable using SO torque in the absence of an external magnetic field. For clarity, FIG. 5 is not to scale. Further, only some components are shown for clarity. For example, the selection device and optional insertion layer are not shown. Although only one magnetic junction 160' and one SO active layer 170 are shown, multiple instances of one or both may be included. The magnetic memory 150' may be used in a variety of electronic devices and is analogous to the magnetic memory 100. As a result, similar components have similar labels. The magnetic memory 150' includes an SO active layer 170 and a magnetic junction 160' including a free layer 162', a nonmagnetic spacer layer 164 and a pinned layer 166' analogous to the SO active layer 130/170 and the magnetic junction 110/160 including the free layer 112/162, the nonmagnetic spacer layer 114/164 and the pinned layer 116/166, respectively. Thus, the components 160', 162', 164, 166' and 170 have similar structure, function and/or location to those of the components 110/160, 112/162, 114/164, 116/166 and 130/170, respectively. Although not shown, an underlying substrate, contacts, seed layer(s), high PMA layer(s), insertion layer(s) and/or capping layer(s) analogous to those described above may be present.

The pinned layer 166' is a synthetic antiferromagnet (SAF) including two magnetic layers 188 and 198 separated by a nonmagnetic layer 196. The nonmagnetic coupling layer may be a conductive layer, such as Ru and/or Ir, that allows for a Ruderman-Kittel-Kasuya-Yosida (RKKY) coupling between the magnetic layers 188 and 198. The magnetic layer 198 is a high PMA layer having a PMA energy greater than its out-of-plane demagnetization energy. Thus, the magnetic moment 199 is perpendicular-to-plane. In some embodiments, the high PMA layer 198 may be a Co/Pt multilayer or alloy. The magnetic layer 188 is a multilayer including a polarization enhancement layer (PEL) 190, a coupling layer 192 and a high PMA layer 194. The PEL layer has a high spin polarization and may be formed of a material such as CoFeB. The high PMA layer 194 has a high perpendicular magnetic anisotropy (PMA energy greater than out-of-plane demagnetization energy). Thus, the high PMA layer 194 has a magnetic moment 195 that is perpendicular to plane. In some embodiments, the high PMA layer 194 may be a Co/Pt multilayer or alloy. The coupling layer 192 may be amorphous in order to reduce or break the crystalline coupling between the layers 190 and 194. The coupling layer 192 is also sufficiently thin to allow the magnetic layers 190 and 194 to be ferromagnetically coupled. For example, the coupling layer 192 may include one or more of Ta, Mo, W, Zr, FeTa, TaZr, FeZr, FeMgO, FeTaZr, FeCoZrB, PbB and FeCoB. The magnetic layers 188 and 198 are antiferromagnetically coupled in the embodiment shown. However in other embodiments, the pinned layer 166' may be formed of other materials and/or layers.

The free layer 162' is a multilayer having a tilted easy axis. In some embodiments, the free layer 162' also has a high damping constant, a, analogous to that of the free layer 162. Magnetic layers 182 and 186 and coupling layer 184 form the free layer 162'. The perpendicular layer 186 has a high PMA. Thus, the easy axis of the perpendicular layer 186, EA2, may be perpendicular-to-plane, as shown in FIG. 5. In some embodiments, the high PMA layer 186 has a high damping constant of at least 0.2.

The selection layer 182 has a tilted easy axis, EA1. In some embodiments, the selection layer 182 has a high damping constant of at least 0.2. The easy axis EA1 is at an angle, $\theta'$, with respect to the z-axis. For example, the selection layer 182 may be a $Tb_x(Fe_{50}Co_{50})_{1-x}$ layer where x is greater than zero and less than one and wherein TbFeCo layer has been fabricated to have the tilted easy axis EA1. The selection layer might be a bilayer of L10 CoPt (111) layer on an MgO/Pt (111) underlayer. For example, the MgO underlayer might be at least six and not more than fourteen Angstroms while the L10 CoPt layer may be at least six and not more than forty Angstroms thick. However, other thicknesses are possible. The selection layer 182 might also be a $Fe_3Pt/[FePt/MgO]_2$ bilayer. Depending on the thicknesses and processing temperature, this material can show tilted easy axis. For example, the thickness of $Fe_3Pt$ layer may be between three and twenty Angstroms and the thickness of FePt may be between three and ten Angstroms. The thickness of MgO layer may be between four and eight Angstroms. The annealing temperature can be between 350 degrees Celsius and 450 degrees Celsius. The magnetic field for such an anneal is at an angle close to and configured to result in the desired angle for the easy axis. For such conditions, the Fe$_3$Pt/[FePt/MgO]$_2$ bilayer may have a tilted easy axis. In some embodiments, the selection layer 182 is at least six Angstroms thick and not more than thirty Angstroms thick. However, other thicknesses are possible. The selection layer 182 is so termed because it is the tilt in the easy axis EA1 that allows the free layer 162' to be written to the desired (selected) state using SO torque in the absence of an external magnetic field or bias.

The coupling layer 184 is amorphous and sufficiently thick such that any crystalline coupling between the magnetic layers 182 and 186 is reduced or broken. The coupling layer 184 is also sufficiently thin that the magnetic layers 182 and 186 are ferromagnetically coupled. In some embodiments, for example, the coupling layer 184 may be at least two Angstroms thick and not more than eight Angstroms thick. However, other thicknesses are possible. The coupling layer 184 may include materials such as Ta, Mo, W, Zr, FeTa, TaZr, FeZr, FeMgO, FeTaZr, FeCoZrB, PbB and FeCoB. The specific materials used in the coupling layer 184 depend upon the materials used for the magnetic layers 182 and 186.

The free layer 162' may be considered to have a tilted easy axis because of the easy axis EA1 and/or because the coupling between the layers 182 and 186 results in the magnetic moment of the free layer being stable at an angle from the z-axis. This angle may be the same as or smaller than θ'.

The magnetic junction 160' functions in an analogous manner to the magnetic junction 110. Thus, driving a write current in-plane through the SO active layer 170 in the +y-direction switches the free layer magnetic moment to one stable state, while driving a write current in-plane through the SO active layer 170 in the −y-direction switches the free layer magnetic moment to another stable state.

The magnetic junction 160', and thus the magnetic memory 150', may have improved performance. The free layer 162' may be written using SO torque and a write current driven in-plane through the SO active layer 170. Thus, a current driven perpendicular-to-plane through the magnetic junction 160' is not required. Because no STT write current is driven through the magnetic junction 160', damage to the magnetic junction 160' may be avoided. Because the free layer 162' has the tilted easy axis, no external magnetic field or magnetic bias is required for writing using SO torque. Consequently, additional current carrying lines need not be included. The use of a long range magnetic field that may disturb neighboring magnetic junctions may also be avoided. If the free layer 162' also has a higher damping constant, switching using SO torque may be faster. Thus, performance of the magnetic memory 150' may be improved.

Figure 6:
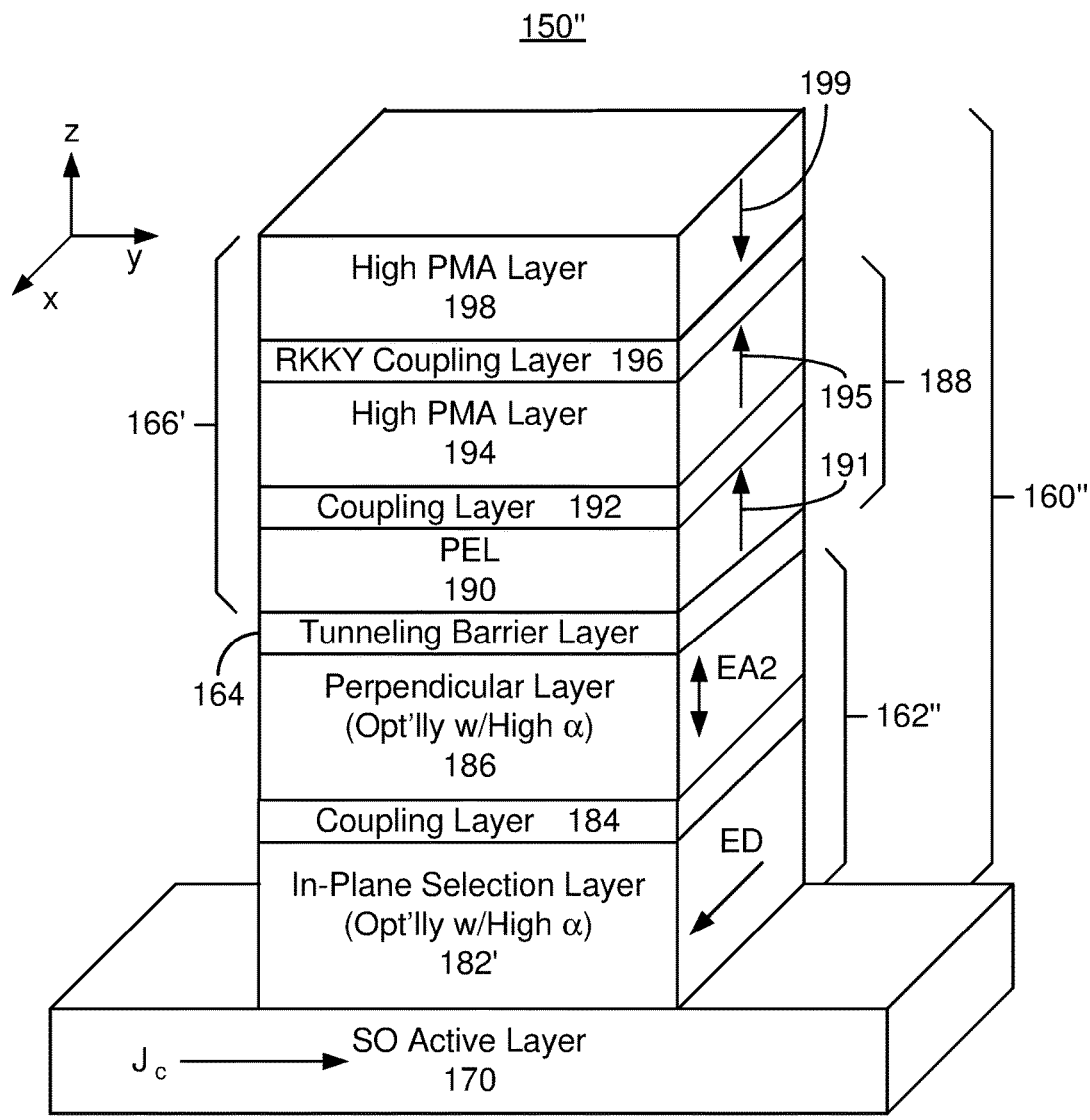
FIG. 6 depicts a perspective view of another exemplary embodiment of a magnetic memory including magnetic junctions programmable using SO torque and including a tilted easy axis and/or a high damping constant.

FIG. 6 depicts a perspective view of another exemplary embodiment of a magnetic memory 150" including magnetic junction(s) 160" programmable using SO torque in the absence of an external magnetic field. For clarity, FIG. 6 is not to scale. Further, only some components are shown for clarity. For example, the selection device and optional insertion layer are not shown. Although only one magnetic junction 160" and one SO active layer 170 are shown, multiple instances of one or both may be included. The magnetic memory 150" may be used in a variety of electronic devices and is analogous to the magnetic memory 100. As a result, similar components have similar labels. The magnetic memory 150" includes an SO active layer 170 and a magnetic junction 160" including a free layer 162", a nonmagnetic spacer layer 164 and a pinned layer 166' analogous to the SO active layer 130/170 and the magnetic junction 110/160/160' including the free layer 112/162/162', the nonmagnetic spacer layer 114/164 and the pinned layer 116/166/166', respectively. Thus, the components 160", 162", 164, 166' and 170 may have similar structure, function and/or location to those of the components 110/160/160', 112/162/162', 114/164, 116/166/166' and 130/170, respectively. Although not shown, an underlying substrate, contacts, seed layer(s), high PMA layer(s) and/or capping layer(s) analogous to those described above may be present.

The pinned layer 166' is a SAF analogous to the pinned layer 166' depicted in FIG. 5. The pinned layer thus includes magnetic layers 188 and 198 separated by a nonmagnetic layer 196 and magnetically coupled via an RKKY coupling. The layers 190, 192, 194, 196 and 198 are analogous to those described above with respect to FIG. 5. However in other embodiments, the pinned layer 166' may be formed of other materials and/or layers.

The free layer 162" is a multilayer having a tilted easy axis. In some embodiments, the free layer 162" also has a high damping constant, a, analogous to that of the free layer 162. Thus, the magnetic layers 182' and/or 186 may have a high damping constant as described above. The coupling layer 184 and high PMA layer 186 are analogous to those described above.

The free layer 162" also includes selection layer 182' shown as having in-plane easy direction ED. Stated differently, the selection layer 182' is an in-plane anisotropic layer. This is because without more, the magnetic moment of the selection layer 182' would be in-plane. However, the selection layer 182' also has a preferred direction (ED) in plane. In other words, the selection layer 182' has direction in plane for which the magnetic energy is lowest. An example of such a material is CoIr$_{20}$. CoIr alloys uniquely have very high $H_k$ values owing to strong demagnetization field Hd and negative $K_1$ magnetocrystalline anisotropy field $H_a$. Consequently, the in-plane magnetization direction is very stable. For example, $H_k$ for Co$_{81}$Ir$_{19}$ is 28 kOe, due to 13 kOe for $H_d$ and 15 kOe for $H_a$. Because of the magnetic coupling between the selection layer 182' and the high PMA layer 186, the free layer 162" has stable states along a tilted easy axis analogous to the easy axis EA depicted in FIG. 1. The tilted easy axis EA can be thus achieved by an exchange coupling between the perpendicular layer 186 and the in-plane selection layer 182', which has strong in-plane magnetic anisotropy field Hk.

The magnetic junction 160" functions in an analogous manner to the magnetic junction 110. Thus, driving a write current in-plane through the SO active layer 170 in the +y-direction switches the free layer magnetic moment to one stable state, while driving a write current in-plane through the SO active layer 170 in the −y-direction switches the free layer magnetic moment to another stable state.

The magnetic junction 160", and thus the magnetic memory 150", may have improved performance. Because no STT write current is driven through the magnetic junction 160", damage to the magnetic junction 160" may be avoided. Because the free layer 162" has the tilted easy axis, no external magnetic field or magnetic bias is required for writing using SO torque. Consequently, additional current carrying lines need not be included. The use of a long range magnetic field that may disturb neighboring magnetic junctions may also be avoided. If the free layer 162" also has a higher damping constant, switching using SO torque may be faster. Thus, performance of the magnetic memory 150" may be improved.

Although specific magnetic junctions 110, 160, 160' and 160" have been described herein, one of ordinary skill in the art will recognize that the features described herein may be combined in manners not explicitly shown. In addition, although described in the context of magnetic memories, the features described herein including but not limited to the magnetic junctions 110, 160, 160' and 160" may be used in other magnetic devices.

Figure 7:
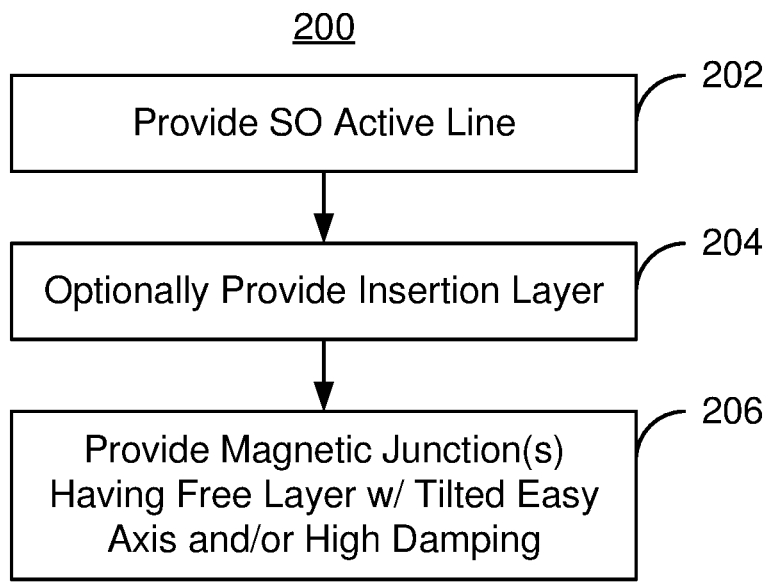
FIG. 7 is a flow chart depicting an exemplary embodiment of a method for providing a magnetic memory programmable using SO torque in and including a tilted easy axis and/or a high damping constant.

FIG. 7 depicts an exemplary embodiment of a method 200 for fabricating a magnetic memory programmable using SO torque in the absence of an external magnetic field and usable in a variety of electronic devices. For simplicity, some steps may be omitted, performed in another order, include substeps and/or combined. Further, the method 200 may start after other steps in forming a magnetic memory have been performed. For simplicity, the method 200 is described in the context of the magnetic memory 100. However, other magnetic memories, including but not limited to the magnetic memories 150, 150' and/or 150" may be formed.

At least one SO active layer 130 is provided, via step 202. Step 202 may include depositing and patterning the desired materials for each SO active layer 130. The insertion layer 102 may optionally be provided, via step 304.

The magnetic junctions 110 may then be formed, via step 206. Step 206 may include blanket depositing the layers for the free layer 112, nonmagnetic spacer layer 114, pinned layer 116 and any additional layers desired in the magnetic junction 110. Anneal(s) and/or other processing steps may also be performed. The magnetic junctions 110 may then be defined. For example, a mask having apertures corresponding to the spacing between magnetic junctions 110 may be formed and a reactive ion etch and/or other removal process carried out. Fabrication of the magnetic memory may then be completed.

Using the method 200, the magnetic memories 100, 150, 150' and/or 150" may be fabricated. As a result, the benefits of the magnetic memories 100, 150, 150' and/or 150" and/or the magnetic junctions 110, 160, 160' and/or 160" may be achieved.

Figure 8:
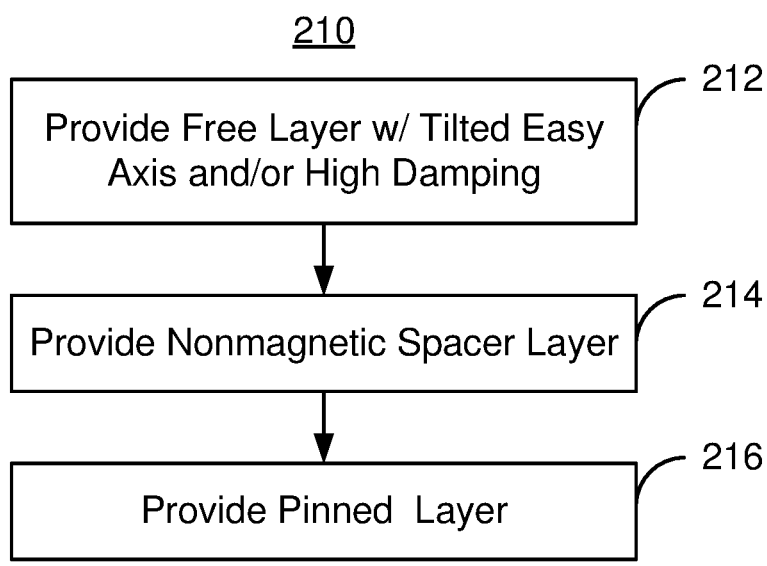
FIG. 8 is a flow chart depicting an exemplary embodiment of a method for providing a magnetic junction programmable using SO torque and including a tilted easy axis and/or a high damping constant.

FIG. 8 depicts an exemplary embodiment of a method 210 for fabricating a magnetic junction programmable using SO torque in the absence of an external magnetic field and usable in a variety of electronic devices. For simplicity, some steps may be omitted, performed in another order, include substeps and/or combined. Further, the method 210 may start after other steps in forming a magnetic memory or other magnetic device have been performed. For simplicity, the method 210 is described in the context of the magnetic junction 110. However, other magnetic junctions, including but not limited to the magnetic junctions 160, 160' and/or 160" may be formed.

A free layer 112 is provided, via step 212. The free layer 212 has a tilted easy axis EA and/or an increased damping constant of at least 0.2. In some embodiments, the free layer 112 adjoins the SO active layer 130. Step 212 may include providing the layer(s) for the free layer 112, 162, 162' and/or 162". Thus, step 212 may include depositing layers, such as the TbFeCo layer, in a high magnetic field and/or annealing some of the layers in a high magnetic field. Also in step 212 high PMA layer(s), coupling layer(s) and/or other layers may be formed. Step 212 may also include providing the appropriate seed and/or capping layers to achieve the desired crystal structure and/or magnetic properties of the free layer 112, 162, 162' and/or 162". Step 212 may also include adding dopants, such as one or more of Pt, Ir, Os, Re, W, Bi, Sm, Ho, Dy and/or Er to increase the damping constant of the layer(s).

A nonmagnetic spacer layer 114 is provided, via step 214. Step 214 may include depositing MgO, which forms a tunneling barrier layer. In some embodiments, step 214 may include depositing MgO using, for example, radio frequency (RF) sputtering. In other embodiments, metallic Mg may be deposited, then oxidized in step 214.

A pinned layer 116 that may have its PMA exceeding its out-of-plane demagnetization energy is provided via step 216. In some embodiments, step 216 may include providing a multilayer such as a SAF, a high PMA multilayer, and/or another multilayer. The free layer 112, nonmagnetic spacer layer 114 and pinned layer 116 may be individually defined in separate removal steps. In general, however, the layers are blanket deposited and processed to form a magnetoresistive stack. The layers may then all be photolithographically defined to form the magnetic junctions 110.

Thus, the magnetic junctions 110, 160, 160', and/or 160" may be formed as a result, the benefits of the magnetic junction(s) 110, 160, 160' and/or 160" may be achieved.

A method and system for providing and using a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic device comprising:
a plurality of magnetic junctions, each of the plurality of magnetic junctions including a free layer, a pinned layer and a nonmagnetic spacer layer, the nonmagnetic spacer layer being between the pinned layer and the free layer, the free layer having at least one of a tilted easy axis and a high damping constant, the tilted easy axis being at a nonzero acute angle from a direction perpendicular-to-plane, the high damping constant being at least 0.02, the free layer having the tilted easy axis, the free layer including a multilayer having a selection layer, a coupling layer and a perpendicular layer, the perpendicular layer having a high perpendicular anisotropy energy greater than an out-of-plane demagnetization energy, the coupling layer being amorphous and between the selection layer and the perpendicular layer, the selection layer being selected from a tilted layer and an in-plane anisotropic layer, the tilted layer having an easy axis at an additional nonzero acute angle from the direction perpendicular-to-plane, the in-plane anisotropic layer having a preferred axis in-plane; and
at least one spin-orbit interaction (SO) active layer adjacent to the free layer of the each of the plurality of magnetic junctions, the at least one SO active layer carrying a current in-plane, the at least one SO active layer exerting a SO torque on the free layer due to the current passing through the at least one SO active layer, the free layer being switchable using the SO torque.

2. The magnetic device of claim 1 wherein the nonzero acute angle is at least five degrees and not more than twenty degrees.

3. The magnetic device of claim 2 wherein the nonzero acute angle is not more than ten degrees.

4. The magnetic device of claim 2 wherein the free layer includes at least one of an L10 CoPt (111) layer on an MgO/Pt (111) underlayer, a $Tb_x(Fe_{50}Co_{50})_{1-x}$ layer where x is greater than zero and less than one and a $Fe_3Pt/[FePt/MgO]_2$ bilayer.

5. The magnetic device of claim 4 wherein the free layer also has the high damping constant.

6. The magnetic device of claim 1 wherein the free layer includes at least one dopant, the at least one dopant providing the high damping constant of at least 0.2.

7. The magnetic device of claim 6 wherein the high damping constant is at least 0.5.

8. The magnetic device of claim 6 wherein the free layer includes at least five atomic percent and not more than twenty atomic percent of the at least one dopant.

9. The magnetic device of claim 5 wherein the at least one dopant includes at least one of Pt, Ir, Os, Re, W, Bi, Sm, Ho, Dy, Er.

10. The magnetic device of claim 9 wherein the at least one dopant is selected from Dy, W and Bi.

11. A magnetic device comprising:
a plurality of magnetic junctions, each of the plurality of magnetic junctions including
a free layer, a pinned layer and a nonmagnetic spacer layer, the nonmagnetic spacer layer being between the pinned layer and the free layer, the free layer having at least one of a tilted easy axis and a high damping constant, the tilted easy axis being at a nonzero acute angle from a direction perpendicular-to-plane, the nonzero acute angle being at least five degrees and not more than ten degrees, the high damping constant being at least 0.02 and not more than 0.8, the free layer having the tilted easy axis; and
at least one spin-orbit interaction (SO) active layer adjacent to the free layer of the each of the plurality of magnetic junctions, the at least one SO active layer carrying a current in-plane, the at least one SO active layer exerting a SO torque on the free layer due to the current passing through the at least one SO active layer, the free layer being switchable using the SO torque;
wherein if the free layer has the tilted easy axis then the free layer includes at least one of an L10 CoPt (111) layer on an MgO/Pt (111) underlayer, a $Tb_x(Fe_{50}Co_{50})_{1-x}$ layer where x is greater than zero and less than one, a $Fe_3Pt/[FePt/MgO]_2$ bilayer, and a multilayer, the multilayer including a selection layer, a coupling layer and a perpendicular layer, the perpendicular layer having a high perpendicular anisotropy energy greater than an out-of-plane demagnetization energy, the coupling layer being amorphous and between the selection layer and the perpendicular layer, the selection layer being selected from a tilted layer and an in-plane anisotropic layer, the tilted layer having an easy axis at an additional nonzero acute angle from the direction perpendicular-to-plane, the in-plane anisotropic layer having a preferred axis in-plane; and
wherein if the free layer includes the high damping constant then the free layer includes at least five atomic percent and not more than twenty atomic percent of at least one dopant, the at least one dopant including at least one of Pt, Ir, Os, Re, W, Bi, Sm, Ho, Dy, Er.

12. A method for providing a magnetic device comprising:
providing a plurality of magnetic junctions, each of the plurality of magnetic junctions including a pinned layer, a nonmagnetic spacer layer and a free layer, the nonmagnetic spacer layer residing between pinned layer and the free layer, the free layer having at least one of a tilted easy axis and a high damping constant, the tilted easy axis being at a nonzero acute angle from a direction perpendicular-to-plane, the high damping constant being at least 0.02, the free layer having the tilted easy axis, the free layer including a multilayer having a selection layer, a coupling layer and a perpendicular layer, the perpendicular layer having a high perpendicular anisotropy energy greater than an out-of-plane demagnetization energy, the coupling layer being amorphous and between the selection layer and the perpendicular layer, the selection layer being selected from a tilted layer and an in-plane anisotropic layer, the tilted layer having an easy axis at an additional nonzero acute angle from the direction perpendicular-to-plane, the in-plane anisotropic layer having a preferred axis in-plane; and
providing at least one spin-orbit interaction (SO) active layer adjacent to the free layer of the each of the plurality of magnetic junctions, the at least one SO active layer carrying a current in-plane, the at least one SO active layer exerting a SO torque on the free layer due to the current passing through the at least one SO active layer, the free layer being switchable using the SO torque.

13. The method of claim 12 wherein the nonzero acute angle is at least five degrees and not more than twenty degrees.

14. The method of claim 13 wherein the step of providing the free layer further includes:
providing at least one of providing an L10 CoPt (111) layer on an MgO/Pt (111) underlayer, depositing a $Tb_x(Fe_{50}Co_{50})_{1-x}$ layer in a magnetic field at an additional nonzero angle from the direction perpendicular-to-plane where x is greater than zero and less than one, depositing the $Tb_x(Fe_{50}Co_{50})_{1-x}$ layer and annealing the $Tb_x(Fe_{50}Co_{50})_{1-x}$ layer in the magnetic field at the additional nonzero angle from the direction perpendicular-to-plane and providing a $Fe_3Pt/[FePt/MgO]_2$ bilayer.

15. The method of claim 12 wherein the free layer also has the high damping constant.

16. The method of claim 12 wherein the step of providing the free layer includes providing at least one dopant in at least one magnetic layer of the free layer, the at least one dopant providing the high damping constant of at least 0.2.

17. The method of claim 16 wherein the at least one magnetic layer of the free layer includes at least five atomic percent and not more than twenty atomic percent of the at least one dopant.

18. The method of claim 17 wherein the at least one dopant includes at least one of Pt, Ir, Os, Re, W, Bi, Sm, Ho, Dy, Er.

* * * * *